(12) United States Patent
Ahmed et al.

(10) Patent No.: US 6,787,439 B2
(45) Date of Patent: Sep. 7, 2004

(54) METHOD USING PLANARIZING GATE MATERIAL TO IMPROVE GATE CRITICAL DIMENSION IN SEMICONDUCTOR DEVICES

(75) Inventors: Shibly S. Ahmed, San Jose, CA (US);
Cyrus E. Tabery, Sunnyvale, CA (US);
Haihong Wang, Fremont, CA (US);
Bin Yu, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 113 days.

(21) Appl. No.: 10/290,276

(22) Filed: Nov. 8, 2002

(65) Prior Publication Data

US 2004/0092062 A1 May 13, 2004

(51) Int. Cl.[7] ................. H01L 21/3205; H01L 21/4763; H01L 21/8238
(52) U.S. Cl. ........................................ 438/585; 438/212
(58) Field of Search ................. 438/585, 149, 438/212

(56) References Cited

U.S. PATENT DOCUMENTS

| | | | |
|---|---|---|---|
| 5,315,143 A | 5/1994 | Tsuji .......................... | 257/351 |
| 6,013,570 A | 1/2000 | Yu et al. ...................... | 438/595 |
| 6,391,782 B1 | 5/2002 | Yu .............................. | 438/696 |
| 6,396,108 B1 | 5/2002 | Krivokapic et al. ........ | 257/365 |
| 6,475,869 B1 | 11/2002 | Yu .............................. | 438/303 |
| 2002/0171107 A1 * | 11/2002 | Cheng et al. ................ | 257/347 |

OTHER PUBLICATIONS

Digh Hisamoto et al., "FinFET–A Self–Aligned Double–Gate MOSFET Scalable to 20nm," IEEE Transactions on Electron Devices, vol. 47, No. 12, Dec. 2000, pp. 2320–2325.

Yang–Kyu Choi et al., "Sub–20nm CMOS FinFET Technologies," 2001 IEEE, IEDM, pp. 421–424.

Xuejue Huang et al., "Sub–50 nm P–Channel FinFET," IEEE Transactions on Electron Devices, vol. 48, No. 5, May 2001, pp. 880–886.

Xuejue Huang et al., "Sub 50–nm FinFET: PMOS," 1999 IEEE, IEDM, pp. 67–70.

Yang–Kyu Choi et al., "Nanoscale CMOS Spacer FinFET for the Terabit Era," IEEE Electron Device Letters, vol. 23, No. 1, Jan. 2002, pp. 25–27.

* cited by examiner

*Primary Examiner*—Craig A. Thompson
(74) *Attorney, Agent, or Firm*—Harrity & Snyder LLP (57) ABSTRACT

A method of manufacturing a semiconductor device may include forming a fin structure on an insulator. The fin structure may include side surfaces and a top surface. The method may also include depositing a gate material over the fin structure and planarizing the deposited gate material. An antireflective coating may be deposited on the planarized gate material, and a gate structure may be formed out of the planarized gate material using the antireflective coating.

20 Claims, 7 Drawing Sheets

METHOD USING PLANARIZING GATE MATERIAL TO IMPROVE GATE CRITICAL DIMENSION IN SEMICONDUCTOR DEVICES

TECHNICAL FIELD

The present invention relates to semiconductor devices and methods of manufacturing semiconductor devices. The present invention has particular applicability to double-gate devices.

BACKGROUND ART

The escalating requirements for high density and performance associated with ultra large scale integration semiconductor devices require design features, such as gate lengths, below 100 nanometers (nm), high reliability and increased manufacturing throughput. The reduction of design features below 100 nm challenges the limitations of conventional methodology.

For example, when the gate length of conventional planar metal oxide semiconductor field effect transistors (MOSFETs) is scaled below 100 nm, problems associated with short channel effects, such as excessive leakage between the source and drain, become increasingly difficult to overcome. In addition, mobility degradation and a number of process issues also make it difficult to scale conventional MOSFETs to include increasingly smaller device features. New device structures are therefore being explored to improve FET performance and allow further device scaling.

Double-gate MOSFETs represent new structures that have been considered as candidates for succeeding existing planar MOSFETs. In several respects, the double-gate MOSFETs offer better characteristics than the conventional bulk silicon MOSFETs. These improvements arise because the double-gate MOSFET has a gate electrode on both sides of the channel, rather than only on one side as in conventional MOSFETs. When there are two gates, the electric field generated by the drain is better screened from the source end of the channel. Also, two gates can control roughly twice as much current as a single gate, resulting in a stronger switching signal.

A FinFET is a recent double-gate structure that exhibits good short channel behavior. A FinFET includes a channel formed in a vertical fin. The FinFET structure may be fabricated using layout and process techniques similar to those used for conventional planar MOSFETs.

DISCLOSURE OF THE INVENTION

Implementations consistent with the present invention provide a method of forming a FinFET device that improves a critical dimension (CD) of the gate. The gate material may be planarized before gate patterning. In addition, an antireflective coating may be formed on the planarized gate material.

Additional advantages and other features of the invention will be set forth in part in the description which follows and in part will become apparent to those having ordinary skill in the art upon examination of the following or may be learned from practice of the invention. The advantages and features of the invention may be realized and obtained as particularly pointed out in the appended claims.

According to the present invention, the foregoing and other advantages are achieved in part by a method of manufacturing a semiconductor device that includes forming a fin structure on an insulator. The fin structure may include side surfaces and a top surface. The method may also include depositing a gate material over the fin structure and planarizing the deposited gate material. An antireflective coating may be deposited on the planarized gate material, and a gate structure may be formed out of the planarized gate material using the antireflective coating.

According to another aspect of the invention, a method of manufacturing a semiconductor device may include forming a fin structure on an insulator and depositing polysilicon over the fin structure. The method may also include polishing the polysilicon to obtain a planar top surface and depositing an antireflective layer on the planar top surface of the polysilicon. A gate structure may be formed out of the polysilicon using the antireflective layer.

According to a further aspect of the invention, a method of manufacturing a semiconductor device may include forming a fin structure on an insulator and depositing polysilicon over the fin structure. The method may also include polishing the polysilicon to obtain a planar top surface and depositing an antireflective coating on the planar top surface of the polysilicon. The method may further include depositing a photoresist layer over the antireflective coating and patterning the photoresist layer to define a gate structure. The polysilicon may be etched from around the defined gate structure.

Other advantages and features of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, where elements having the same reference number designation may represent like elements throughout.

BEST MODE FOR CARRYING OUT THE INVENTION

The following detailed description of the invention refers to the accompanying drawings. The same reference numbers in different drawings may identify the same or similar elements. Also, the following detailed description does not limit the invention. Instead, the scope of the invention is defined by the appended claims and their equivalents.

Implementations consistent with the present invention provide a method of forming a FinFET device that improves a smallest feature size in the gate. To improve the smallest feature size, the gate material may be planarized before gate patterning. In addition, an antireflective coating may be formed on the planarized gate material.

Figure 1:
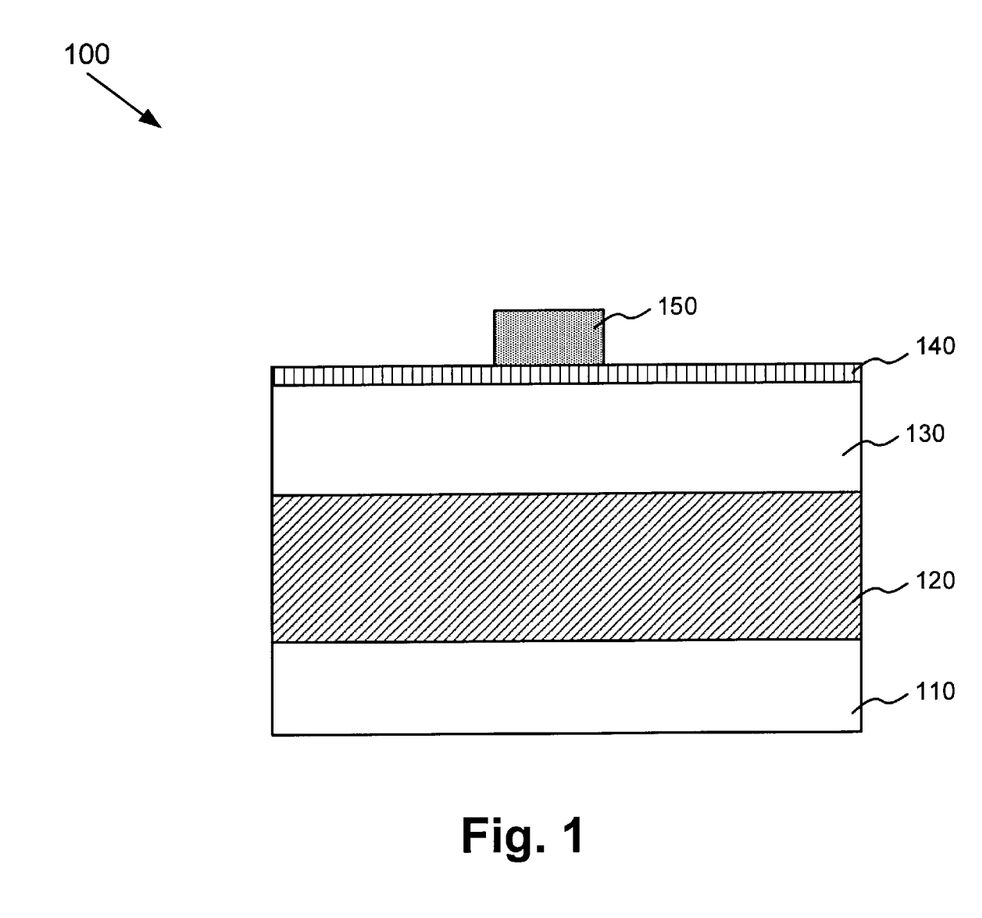
FIG. 1 is a cross-section illustrating exemplary layers that may be used for forming a fin in accordance with an embodiment of the present invention.

FIG. 1 illustrates the cross-section of a semiconductor device 100 formed in accordance with an embodiment of the present invention. Referring to FIG. 1, semiconductor device 100 may include a silicon on insulator (SOI) structure that includes a silicon substrate 110, a buried oxide layer 120 and a silicon layer 130 formed on the buried oxide layer 120. Buried oxide layer 120 and silicon layer 130 may be formed on substrate 110 in a conventional manner.

In an exemplary implementation, buried oxide layer 120 may include a silicon oxide and may have a thickness ranging from about 1000 Å to about 3000 Å. Silicon layer 130 may include monocrystalline or polycrystalline silicon having a thickness ranging from about 300 Å to about 1500 Å. Silicon layer 130 is used to form a fin structure for a double gate transistor device, as described in more detail below.

In alternative implementations consistent with the present invention, substrate 110 and layer 130 may include other semiconducting materials, such as germanium, or combinations of semiconducting materials, such as silicon-germanium. Buried oxide layer 120 may also include other dielectric materials.

A dielectric layer 140, such as a silicon nitride layer or a silicon oxide layer (e.g., $SiO_2$), may be formed over silicon layer 130 to act as a protective cap during subsequent etching processes. In an exemplary implementation, dielectric layer 140 may be deposited at a thickness ranging from about 150 Å to about 700 Å. Next, a photoresist material may be deposited and patterned to form a photoresist mask 150 for subsequent processing. The photoresist may be deposited and patterned in any conventional manner.

Semiconductor device 100 may then be etched and the photoresist mask 150 may be removed. In an exemplary implementation, silicon layer 130 may be etched in a conventional manner, with the etching terminating on buried oxide layer 120 to form a fin. After the formation of the fin, source and drain regions may be formed adjacent the respective ends of the fin. For example, in an exemplary embodiment, a layer of silicon, germanium or combination of silicon and germanium may be deposited, patterned and etched in a conventional manner to form source and drain regions.

Figure 2A:
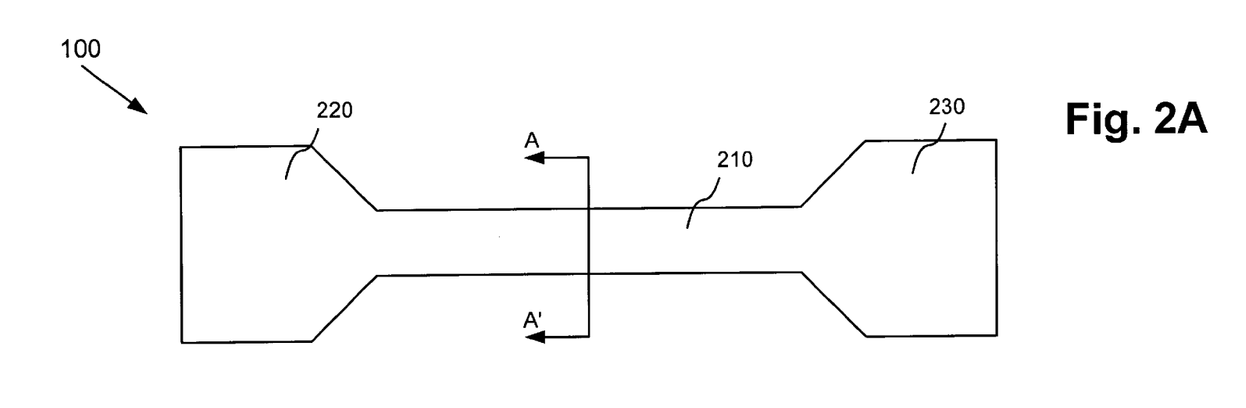
FIG. 2A schematically illustrates the top view of a fin structure in accordance with an exemplary embodiment of the present invention.

FIG. 2A schematically illustrates the top view of a fin structure on semiconductor 100 formed in such a manner. Source region 220 and drain region 230 may be formed adjacent to and at the ends of fin 210 on buried oxide layer 120, according to an exemplary embodiment of the present invention.

Figure 2B:
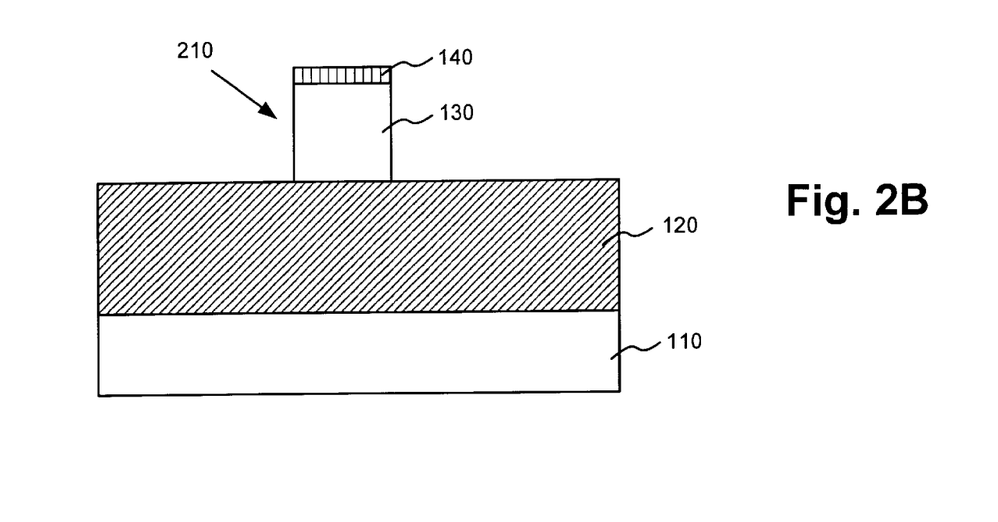
FIG. 2B is a cross-section illustrating the formation of the fin structure of FIG. 2A in accordance with an exemplary embodiment of the present invention.

FIG. 2B is a cross-section along line A–A' in FIG. 2A illustrating the formation of fin structure 210 in accordance with an exemplary embodiment of the present invention. As described above, dielectric layer 140 and silicon layer 130 may be etched to form fin 210. Fin 210 may include silicon 130 and a dielectric cap 140.

Figure 3:
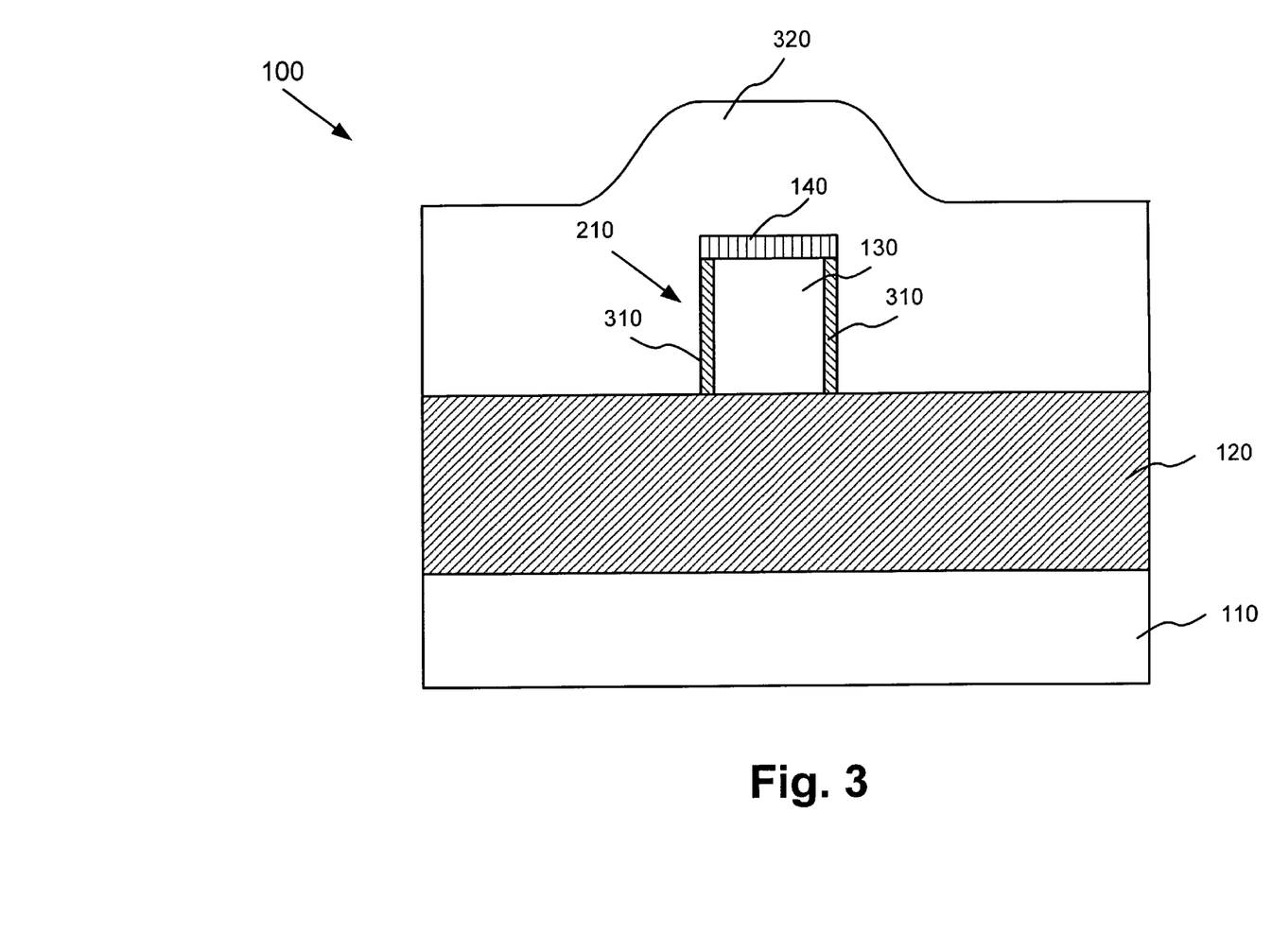
FIG. 3 is a cross-section illustrating the formation of a gate dielectric layer and gate material on the device of FIG. 2B in accordance with an exemplary embodiment of the present invention.

FIG. 3 is a cross-section illustrating the formation of a gate dielectric layer and gate material on fin 210 in accordance with an exemplary embodiment of the present invention. A dielectric layer may be formed on fin 210. For example, a thin oxide film 310 may be thermally grown on fin 210, as illustrated in FIG. 3. The oxide film 310 may be grown to a thickness of about 10 Å to about 50 Å and may be formed on the exposed side surfaces of silicon 130 in fin 210 to act as a dielectric layer for a subsequently formed gate electrode. Similar to the oxide film 310, the dielectric cap 140 may provide electrical insulation for the top surface of fin 210.

A gate material layer 320 may be deposited over semiconductor device 100 after formation of the oxide film 310. The gate material layer 320 may include the material for the subsequently formed gate electrode. In an exemplary implementation, the gate material layer 320 may include polysilicon deposited using conventional chemical vapor deposition (CVD) or other well known technique. Alternatively, other semiconducting materials, such as germanium or combinations of silicon and germanium, or various metals may be used as the gate material.

Figure 4:
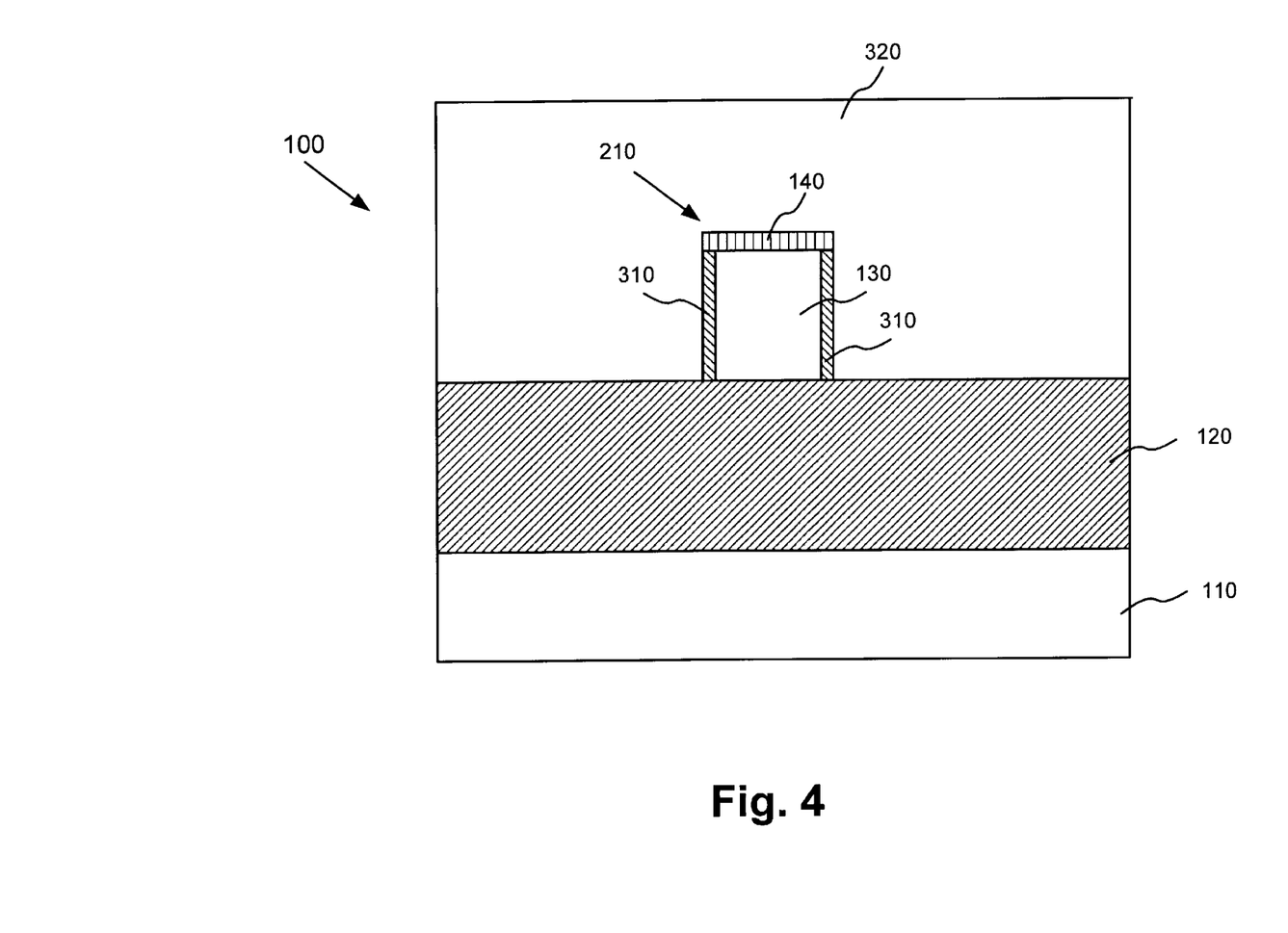
FIG. 4 is a cross-section illustrating the planarizing of the gate material of FIG. 3 in accordance with an exemplary embodiment of the present invention.

FIG. 4 is a cross-section illustrating the planarizing of the gate material 320 in accordance with an exemplary embodiment of the present invention. Planarizing the gate material 320 may remove any non-planar protrusions in the material, such as that shown above the fin 210 in FIG. 3. Returning to FIG. 4, chemical-mechanical polishing (CMP) or other conventional technique may be performed so that the upper surface of gate material 320 is substantially planar. In one implementation, shown in FIG. 4, the planar gate material 320 may extend above the dielectric cap 140. A thickness of the gate material 320 after planarizing may range from about 700 Å to about 2000 Å.

In an alternate implementation (not shown) consistent with the principles of the invention, the gate material 320 may be planarized down to the upper surface of dielectric cap 140. The upper surface of the gate material 320 may be separated by the upper surface of dielectric cap 140 at the fin 210 as a result. In such an implementation, gate material 320 may be patterned into two physically and electrically separate gates.

Figure 5A:
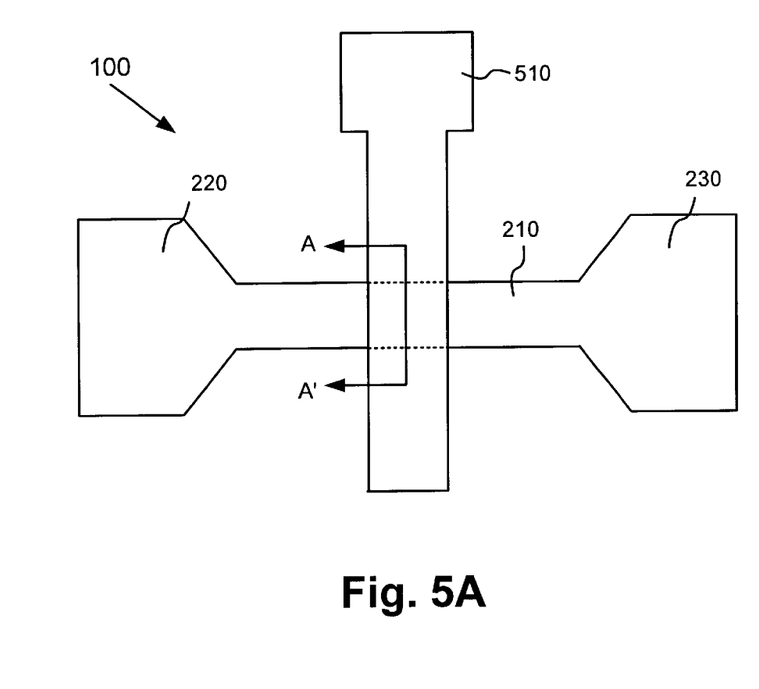
Fig. 5A schematically illustrates the top view of a FinFET structure in accordance with an exemplary embodiment of the present invention.

FIG. 5A schematically illustrates the top view of semiconductor device 100 in accordance with an exemplary embodiment of the present invention. As illustrated, a gate structure 510 may be patterned to extend across a channel region of the fin 210. Gate structure 510 may include a gate portion proximate to the sides of the fin 210 and a larger electrode portion spaced apart from the fin 210. The electrode portion of gate structure 510 may provide an accessible electrical contact for biasing or otherwise controlling the gate portion.

Figure 5B:
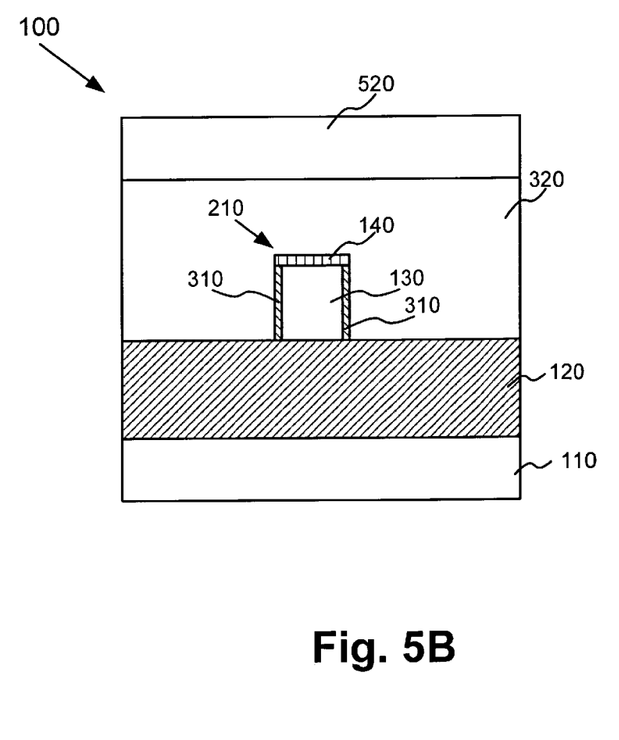
FIG. 5B is a cross-section illustrating the formation of the FinFET structure of FIG. 5A in accordance with an exemplary embodiment of the present invention.

FIG. 5B is a cross-section illustrating the formation of the semiconductor device 100 of FIG. 5A in accordance with an exemplary embodiment of the present invention. Gate structure 510 may be defined in the gate material layer 320 by lithography (e.g., photolithography). A bottom antireflective coating (BARC) layer 520 may be deposited on the planar gate material layer 320. As will be understood by those skilled in the semiconductor art, photoresist may be deposited on the BARC layer 520 and patterned in the shape of gate structure 510.

Gate material layer 320 then may be selectively etched to form the gate structure 510 out of the gate material layer 320 on device 100. The planar gate material layer 320 may provide at least a planar bottom surface for BARC layer 520, and may tend to flatten the top surface of BARC layer 520. BARC layer 520 may have a thickness ranging from about 100 Å to about 500 Å. Because of the planar gate material layer 320, the photoresist over the BARC layer 520 may be patterned more precisely, and the gate structure 510's critical dimension (CD) (i.e., its smallest feature size) may be improved. For example, gate CDs in a range from about 20 nm to about 50 nm may be achieved due to the planarizing of gate material 320 by CMP. Thus, a planar top surface of gate material 320, as opposed to the highly non-planar surface during typical FinFET gate definition, may improve the CD of gate structure 510.

The source/drain regions 220 and 230 may then be doped. For example, n-type or p-type impurities may be implanted in source/drain regions 220 and 230. The particular implantation dosages and energies may be selected based on the particular end device requirements. One of ordinary skill in this art would be able to optimize the source/drain implantation process based on the circuit requirements and such acts are not disclosed herein in order not to unduly obscure the thrust of the present invention. In addition, sidewall spacers (not shown) may optionally be formed prior to the source/drain ion implantation to control the location of the source/drain junctions based on the particular circuit requirements. Activation annealing may then be performed to activate the source/drain regions 220 and 230.

Thus, in accordance with the present invention, the gate CD in a double-gate FinFET device is improved by planarizing gate material 320 prior to depositing BARC layer 520 and defining the gate. Advantageously, the resulting structure exhibits good short channel behavior. In addition, the present invention provides increased flexibility and can be easily integrated into conventional processing.

Other Implementations

Figure 6A:
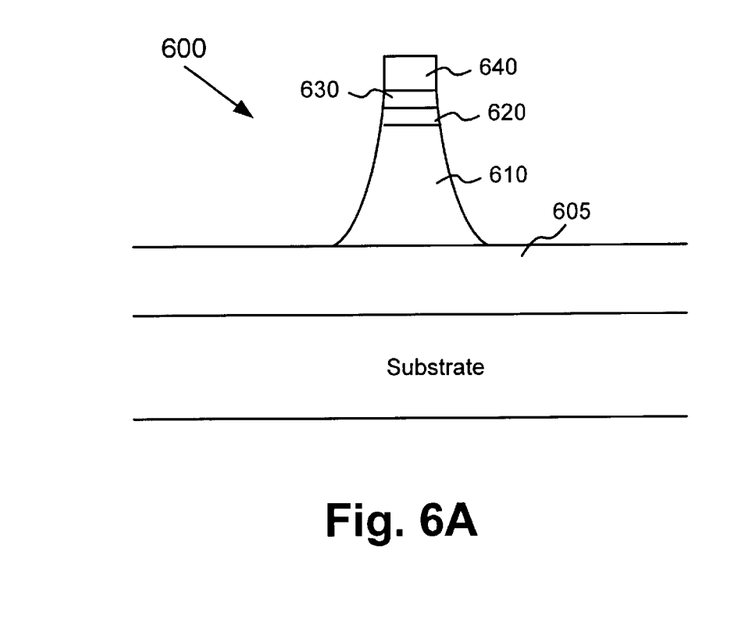
FIGS. 6A and 6B are cross-sections illustrating improving an etch profile of a fin in accordance with another implementation of the present invention.

In some implementations, it may be desirable to improve an etch profile in the fin of a FinFET. FIG. 6A is a cross-section illustrating a typical etch profile of a fin 600. Using a regular poly etch process, fin 600 may be formed on a buried oxide layer 605 of a silicon on insulator (SOI) structure as shown in FIG. 6A. Fin 600 may include a silicon (Si) portion 610, a silicon dioxide ($SiO_2$) layer 620, a silicon nitride (SiN) layer 630, and a photoresist mask layer 640. Using the typical etching process to form fin 600 may result in "big footing" shown in FIG. 6A, where the base of the silicon portion 610 increases in width at its base. Such footing may result in unequal channel dimensions in the resulting FinFET.

Figure 6B:
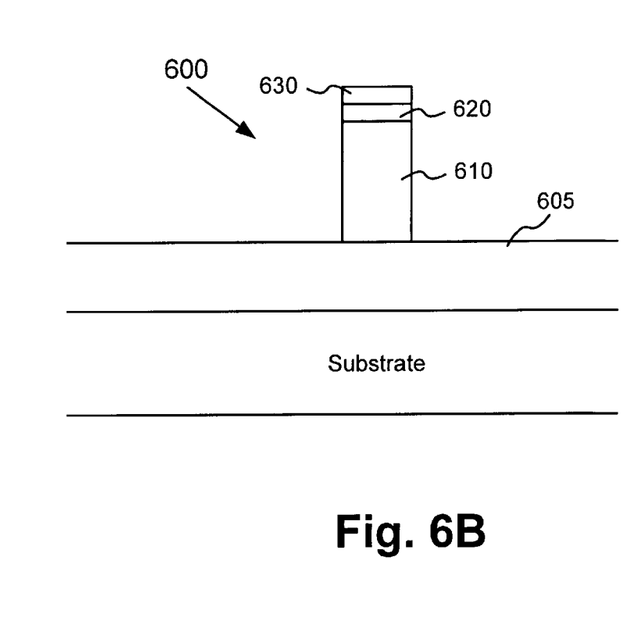

FIG. 6B is a cross-section illustrating an improved, vertical etch profile of the fin 600. Using a T-gate or notch gate etch approach, fin 600 may be formed on a buried oxide layer 605 of a silicon on insulator (SOI) structure with an enhanced profile as shown in FIG. 6B. First, the photoresist layer 640 may be trimmed to the proper shape. An opening for the $SiO_2$ layer 620 and SiN layer 630 may be created by removing the photoresist layer.

The remaining Si layer 610 may be etched in three stages: a main etch, a soft landing, and an over etch. The main etch stage may use a $CF_4$/HBr/$Cl_2$/He—$O_2$ gas combination. The soft landing stage may use an HBr/He—$O_2$ gas combination. The over etch stage also may use an HBr/He—$O_2$ gas combination. Other gas combinations may alternatively be used, as will be understood by those skilled in the art. By varying the soft landing and over etch gas ratios, pressures, and power, the overall etch profile of fin 600 may be compensated to form a vertical profile. For a more isotropic etch, $Cl_2$ may be added to the soft landing and over etch stages when necessary. In this manner, the footed etch profile of fin 600 shown in FIG. 6A may be improved to the vertical profile shown in FIG. 6B.

Figure 7A:
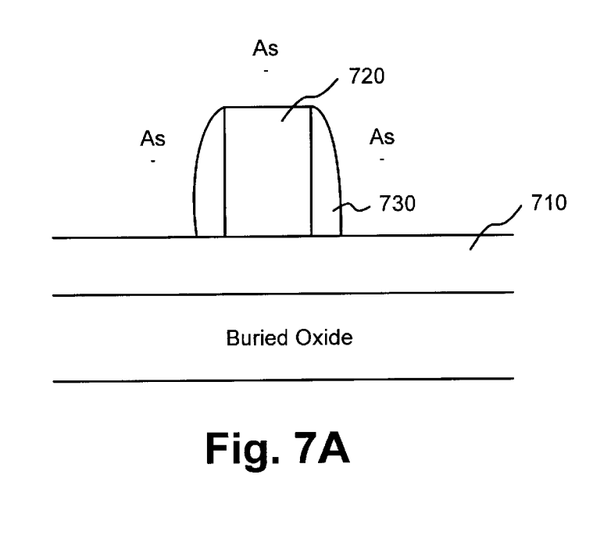
FIGS. 7A–7C are cross-sectional and top views illustrating vertically uniform doping of a source-drain junction and gate in accordance with another implementation of the present invention.
Figure 7B:
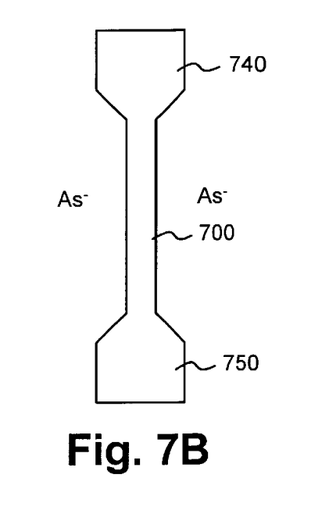
Figure 7C:
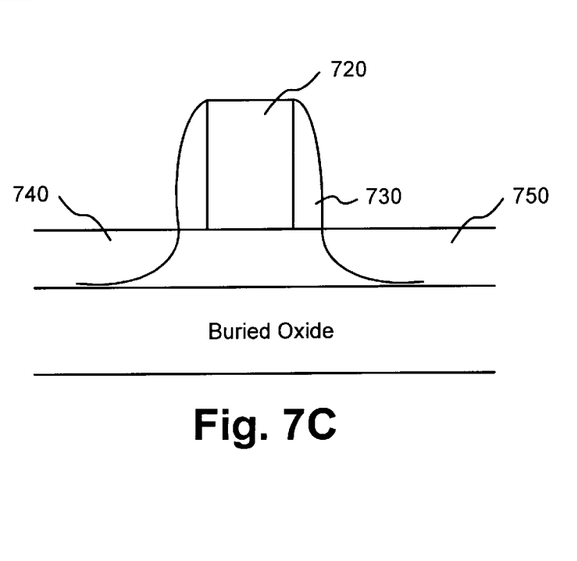

In other implementations, a FinFET with a vertically uniform-doped junction and gate may be desired. FIGS. 7A–7C are cross-sectional and top views illustrating plasma doping of a source-drain junction and gate in accordance with another implementation of the present invention. A gate 720 and spacers 730 may be formed on a silicon layer 710. Silicon layer 710 may be formed into a fin structure. FIG. 7B illustrates a top view of fin 700 located between a source region 740 and a drain region 750.

After patterning of the gate 720, the source region 740 and drain region 750 may be doped with plasma, as shown in FIGS. 7A and 7B. In one implementation, the plasma may include arsenic (As). FIG. 7C illustrates vertically doped source and drain regions 740 and 750. In this manner, the source/drain junction may be uniformly doped in the vertical direction.

In the previous descriptions, numerous specific details are set forth, such as specific materials, structures, chemicals, processes, etc., in order to provide a thorough understanding of the present invention. However, the present invention can be practiced without resorting to the specific details set forth herein. In other instances, well known processing structures have not been described in detail, in order not to unnecessarily obscure the thrust of the present invention.

The dielectric and conductive layers used in manufacturing a semiconductor device in accordance with the present invention can be deposited by conventional deposition techniques. For example, metallization techniques, such as various types of CVD processes, including low pressure CVD (LPCVD) and enhanced CVD (ECVD) can be employed.

The present invention is applicable to the formation of any of various types of semiconductor devices, and hence, details have not been set forth in order to avoid obscuring the thrust of the present invention. In practicing the present invention, conventional photolithographic and etching techniques are employed and, hence, the details of such techniques have not been set forth herein in detail.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

No element, act, or instruction used in the description of the present application should be construed as critical or essential to the invention unless explicitly described as such. Also, as used herein, the article "a" is intended to include one or more items. Where only one item is intended, the term "one" or similar language is used. The scope of the invention is defined by the claims and their equivalents.

What is claimed is:

1. A method of manufacturing a semiconductor device, comprising:

forming a fin structure on an insulator, the fin structure including side surfaces and a top surface;

depositing a gate material over the fin structure;

planarizing the deposited gate material;

depositing an antireflective coating on the planarized gate material; and forming a gate structure out of the planarized gate material using the antireflective coating.

2. The method of claim 1, wherein the forming a fin structure includes:

depositing a dielectric layer on a silicon layer, and etching the dielectric layer and the silicon layer to define the fin structure with a silicon portion and a dielectric cap.

3. The method of claim 2, further comprising:

growing oxide layers on sides of the silicon portion.

4. The method of claim 1, wherein the depositing a gate material includes:

depositing polysilicon over the fin structure.

5. The method of claim 1, wherein the planarizing includes:

polishing a top surface of the deposited gate material by a chemical mechanical process.

6. The method of claim 1, wherein the planarizing includes:

planarizing the deposited gate material proximate to the fin.

7. The method of claim 1, wherein the forming a gate structure includes:

depositing a photoresist layer over the antireflective coating, and patterning the photoresist layer to define the gate structure.

8. The method of claim 7, wherein the forming a gate structure includes:

selectively etching the photoresist layer and the gate material to form the gate structure.

9. The method of claim 1, wherein a smallest feature size of the gate structure is less than or equal to about 50 nm.

10. The method of claim 1, further comprising:

forming source and drain regions at ends of the fin structure.

11. The method of claim 10, further comprising:

implanting impurities in the source and drain regions; and annealing the semiconductor device to activate the source and drain regions.

12. A method of manufacturing a semiconductor device, comprising:

forming a fin structure on an insulator;

depositing polysilicon over the fin structure;

polishing the polysilicon to obtain a planar top surface;

depositing an antireflective layer on the planar top surface of the polysilicon; and forming a gate structure out of the polysilicon using the antireflective layer.

13. The method of claim 12, wherein the polishing includes chemical mechanical polishing of the polysilicon.

14. The method of claim 12, wherein the forming a gate structure includes:

defining the gate structure, and removing the polysilicon from around the defined gate structure.

15. The method of claim 14, wherein the defining the gate structure includes:

depositing a photoresist layer over the antireflective coating, and patterning the photoresist layer to define the gate structure.

16. The method of claim 12, further comprising:

forming source and drain regions at ends of the fin structure.

17. The method of claim 12, wherein a smallest feature size of the gate structure is between about 20 nm and about 50 nm.

18. A method of manufacturing a semiconductor device, comprising:

forming a fin structure on an insulator;

depositing polysilicon over the fin structure;

polishing the polysilicon to obtain a planar top surface;

depositing an antireflective coating on the planar top surface of the polysilicon;

depositing a photoresist layer over the antireflective coating;

patterning the photoresist layer to define a gate structure; and etching the polysilicon from around the defined gate structure.

19. The method of claim 18, wherein the fin structure includes a silicon channel and bordering dielectric material.

20. The method of claim 18, wherein a smallest feature size of the defined gate structure is between about 20 nm and about 50 nm.

* * * * *